United States Patent
Tsai (10) Patent No.: US 9,013,925 B2
(45) Date of Patent: Apr. 21, 2015

(54) NONVOLATILE SEMICONDUCTOR MEMORY DEVICE

(71) Applicant: Elite Semiconductor Memory Technology Inc., Hsinchu (TW)

(72) Inventor: Cheng-Hung Tsai, New Tapiei (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 32 days.

(21) Appl. No.: 13/947,196

(22) Filed: Jul. 22, 2013

(65) Prior Publication Data

US 2015/0023109 A1    Jan. 22, 2015

(51) Int. Cl.
*G11C 16/06* (2006.01)
*G11C 16/24* (2006.01)
*G11C 16/30* (2006.01)
*G11C 16/00* (2006.01)
*G11C 16/12* (2006.01)

(52) U.S. Cl.
CPC ............... *G11C 16/24* (2013.01); *G11C 16/30* (2013.01); *G11C 16/00* (2013.01); *G11C 16/12* (2013.01)

(58) Field of Classification Search
CPC ........ G11C 16/00; G11C 16/12; G11C 16/30; G11C 5/145; G11C 16/3436; G11C 11/34; G11C 16/04
USPC .............. 365/185.23, 189.09, 189.07, 189.22
See application file for complete search history.

(56) References Cited

U.S. PATENT DOCUMENTS 5,218,569 A * 6/1993 Banks ....................... 365/185.21
7,139,192 B1 * 11/2006 Wong ........................ 365/185.03
8,400,212 B1 * 3/2013 Nguyen et al. ................ 327/536

* cited by examiner

*Primary Examiner* — Gene Auduong
(74) *Attorney, Agent, or Firm* — Juan Carlos A. Marquez; Bacon & Thomas PLLC (57) ABSTRACT

A nonvolatile semiconductor memory device comprises a memory cell array, a staircase voltage generator, and a decode and level shift circuit. The memory cell array comprises a plurality of memory cells and a plurality of bit lines coupled to the plurality of memory cells. The staircase voltage generator generates a staircase voltage having a staircase waveform that varies in at least two steps. The decode and level shift circuit selects one of said plurality of bit lines and applies the staircase voltage as a program voltage to the selected bit line.

11 Claims, 8 Drawing Sheets

NONVOLATILE SEMICONDUCTOR MEMORY DEVICE

BACKGROUND OF THE INVENTION

1. Field of the Invention

The present invention relates to technology for programming a nonvolatile semiconductor memory device.

2. Description of the Related Art

Semiconductor memory devices are devices in which data can be stored and from which stored data can be retrieved. Semiconductor memory devices can be classified into volatile memory and nonvolatile memory. The volatile memory needs a power supply to retain data while the nonvolatile memory can retain data even when power is removed. Therefore, the nonvolatile memory devices have been widely used in applications in which power can be interrupted suddenly.

Figure 1:
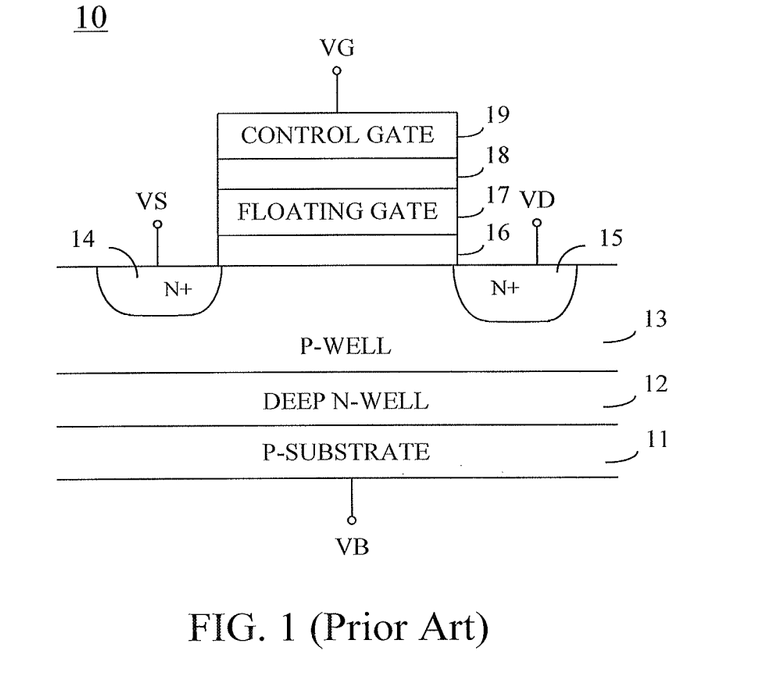
FIG. 1 shows a vertical cross-section of a flash EEPROM cell.

The nonvolatile memory devices comprise electrically erasable and programmable ROM cells, known as flash EEPROM cells. FIG. 1 shows a vertical cross-section of the flash EEPROM cell 10. Referring to FIG. 1, a deep n-type well 12 is formed in a bulk region or a P-type substrate 11, and a p-type well 13 is formed in the n-type well 12. An N-type source region 14 and an N-type drain region 15 are formed in the P-type well 13. A p-type channel region is formed between the source region 14 and the drain region 15. A floating gate 17, which is insulated by an insulating layer 16, is formed on the P-type channel region. A control gate 19, which is insulated by another insulating layer 18, is formed above the floating gate 17.

Figure 2:
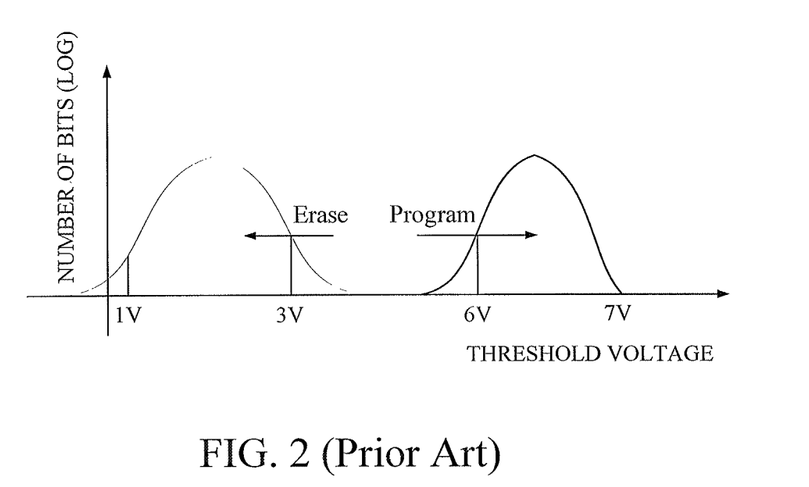
FIG. 2 shows threshold voltages of the flash EEPROM cell during program and erase operations.

FIG. 2 shows threshold voltages of the flash EEPROM cell 10 during program and erase operations. Referring to FIG. 2, the flash EEPROM cell 10 has a higher threshold voltage range (about 6 to 7V) during the program operation, and has a lower threshold voltage range (about 1 to 3V) during the erase operation.

Referring to FIGS. 1 and 2, during the program operation, hot electrons need to be injected from the channel region adjacent to the drain region 15 to the floating gate electrode, so that the threshold voltage of the EEPROM cell increases. In contrast, during the erase operation, the hot electrons injected into the floating gate 17 during the program operation need to be removed, so that the threshold voltage of the EEPROM cell decreases. Therefore, the threshold voltages of the EEPROM cell are varied after the program and erase operation.

Figure 3:
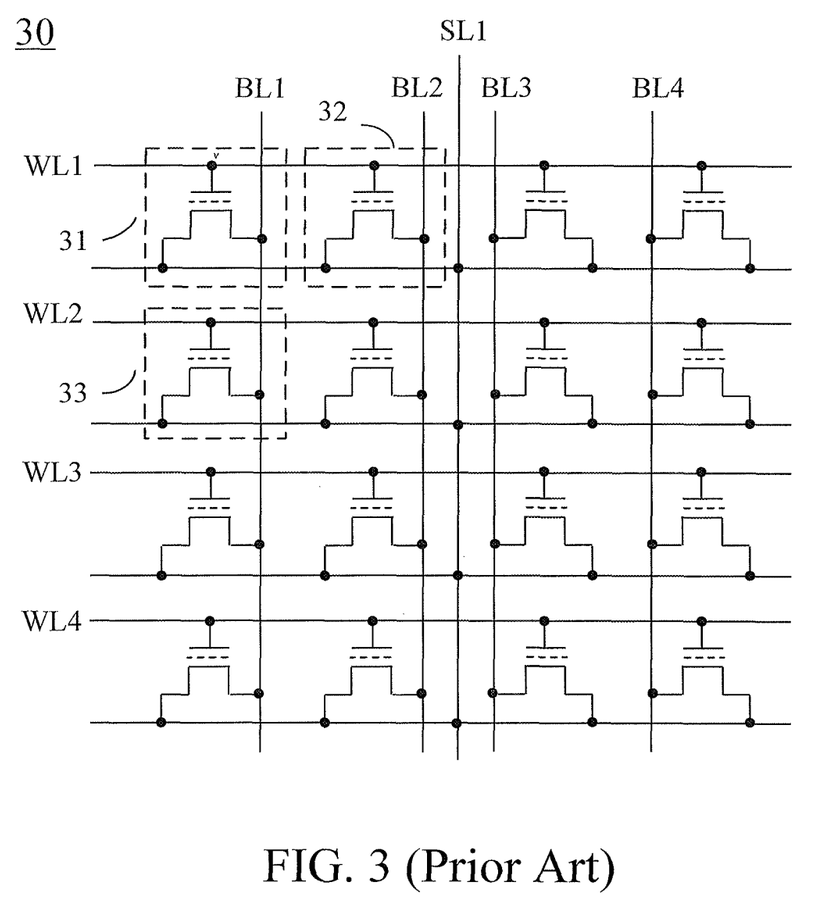
FIG. 3 shows a typical flash memory array architecture using a NOR structure.

FIG. 3 shows a typical flash memory array architecture using a NOR structure. Referring to FIG. 3, the flash memory array 30 includes a plurality of flash memory cells 31 to 33 that are defined in regions where a plurality of word lines WL1 to WL4, a plurality of bit lines BL1 to BL4, and a source line SL1 cross. Two adjacent flash memory cells 31 and 32 in is FIG. 3, which are respectively coupled to the same word line WL1 and different bit lines BL1 and BL2, share the same source SL1. The NOR flash memory device in general is configured such that 8 or 16 different bit lines can share one common source line.

During a program operation, a program voltage VPP (e.g., 4V) is applied to a bit line connected to a selected cell transistor, a ground voltage VSS is applied to a source line connected to the selected cell transistor, and a high voltage VH (e.g., 9V) is applied to a word line connected to the selected cell transistor. Meanwhile, the ground voltage VSS is applied to a word line connected to an unselected cell transistor. For example, if the memory cell 31 is selected to be programmed and the memory cell 32 is selected not to be programmed, the program voltage VPP is applied to the bit line BL1, the ground voltage VSS is applied to the source line SL1, the bit line BL2 and other word lines WL2 to WL4, while the high voltage VH is applied to the word line WL1. Under this condition, the cell transistor 31 is programmed to high threshold voltage. However, because the program voltage VPP is applied to all cells connected to the same bit line BL1, the state of another unselected memory cell 33 adjacent to the cell 31 might unintentionally be affected. This condition is usually called "program disturb." The threshold voltage distribution of the unselected memory cells is shifted to the right when the program disturb occurs.

Thus, there is a need for a new mechanism to reduce the impact of program disturb.

SUMMARY OF THE INVENTION

An aspect of the present invention is to provide a nonvolatile semiconductor memory device. According to one embodiment of the present invention, the nonvolatile semiconductor memory device comprises a memory cell array, a staircase voltage generator, and a decode and level shift circuit. The memory cell array comprises a plurality of memory cells and a plurality of bit lines coupled to the plurality of memory cells. The staircase voltage generator generates a staircase voltage having a staircase waveform that varies in at least two steps. The decode and level shift circuit selects one of said plurality of bit lines and applies the staircase voltage as a program voltage to the selected bit line.

BRIEF DESCRIPTION OF THE DRAWINGS

The invention will be described according to the appended drawings in which.

DETAILED DESCRIPTION OF THE INVENTION

Figure 4:
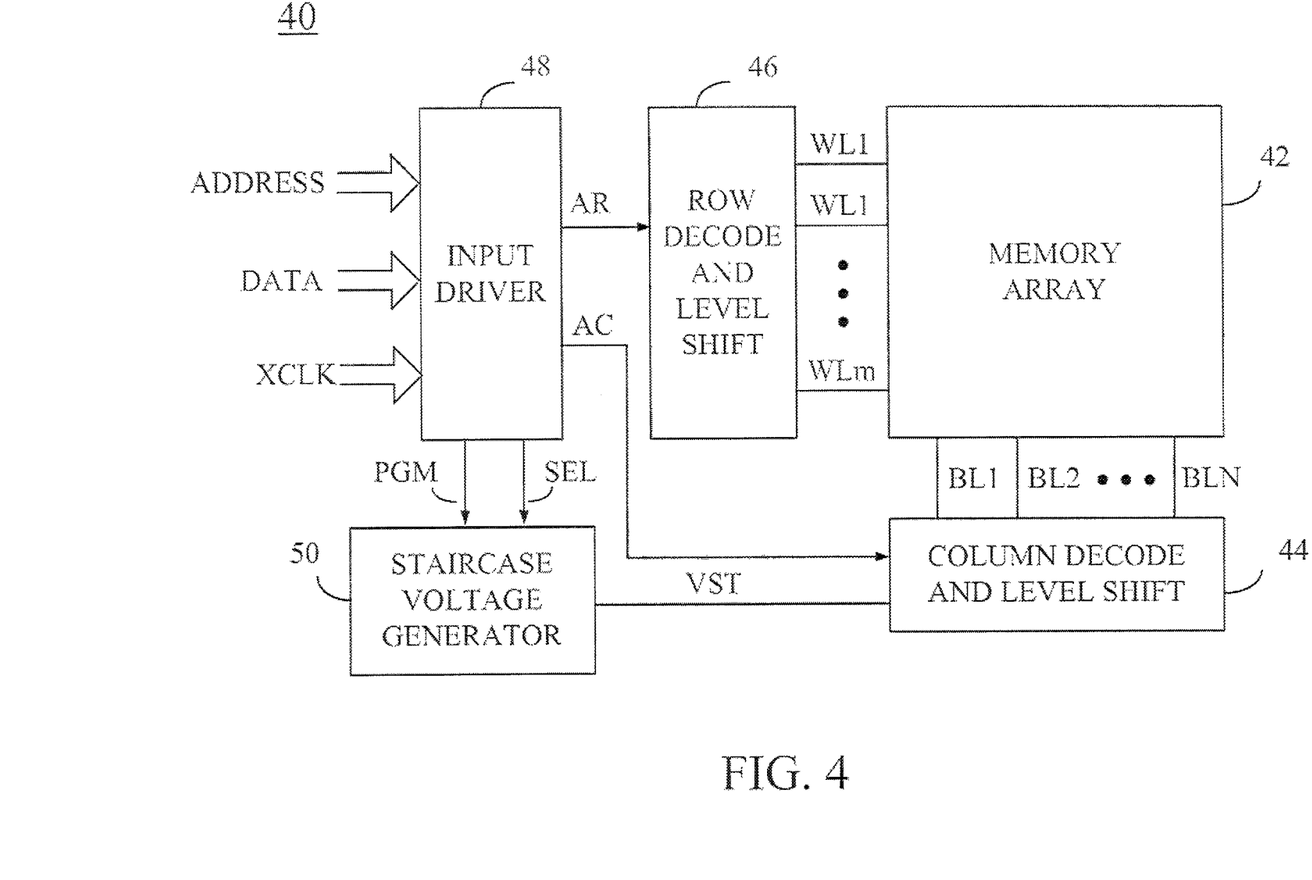
FIG. 4 shows a block diagram of a nonvolatile semiconductor memory device according to one embodiment of the present invention.

In order to explain the method for programming a plurality of memory cells of a nonvolatile semiconductor memory device of the present invention, the nonvolatile semiconductor memory device that performs the method of the present invention will be described herein. FIG. 4 shows a block diagram of a nonvolatile semiconductor memory device 40 according to one embodiment of the present invention. Referring to FIG. 4, the memory device 40 comprises the memory array 42, a column decode and level shift circuit 44, a row decode and level shift circuit 46, an input driver 48, and a staircase voltage generator 50.

Figure 5:
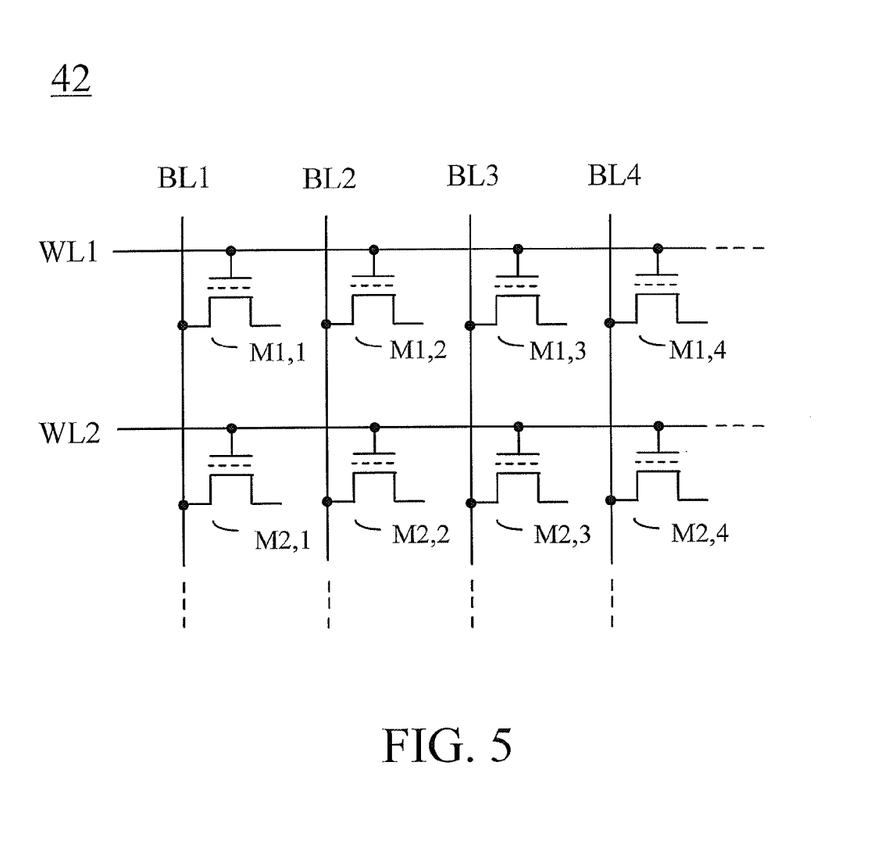
FIG. 5 shows a part of the memory array of FIG. 4.

FIG. 5 shows a part of the memory array 42 of FIG. 4. For the purpose of concision, the memory array 42 shown in FIG. 5 comprising eight memory cell transistors M1,1 to M2,4, two word lines WL1 and WL2, and four bit lines BL1 to BL4 is exemplified. Referring to FIG. 5, the eight memory cell transistors M1,1 to M2,4 are arranged. The cell transistors M1,1 to M1,4 in the first row are connected to the word line WL1 and to one of the bit lines BL1 to BL4. The cell transistors M2,1 to M2,4 in the second row are connected to the word line WL2 and to one of the bit lines BL1 to BL4.

Referring to FIG. 4 and FIG. 5, to program the memory cell transistors in the memory array 42, the staircase voltage generator 50 generates a staircase voltage VST to the column decode and level shift circuit 44 in response to a mode signal PGM issued form the input driver 48. During the program operation, the row decode and level shift circuit 46 selects one of the word lines from the memory array 42 in response to an address signal AR output form the input driver 48, and the column decode and level shift circuit 44 selects one of the bit lines from the memory array 42 in response to an address signal AC output form the input driver 48. For example, the row decode and level shift circuit 46 first selects the first word line WL1, and then a high voltage VH (e.g., 9V) is applied to the gates of the cell transistors M1,1 to M1,4 through the selected word line WL1. Thereafter, the column decode and level shift circuit 44 sequentially selects the first to fourth bit lines BL1 to BL4 and supplies the staircase voltage VST as a program voltage to the drains of the cell transistors M1,1 to M1,4 through the selected bit lines BL1 to BL4.

Figure 6:
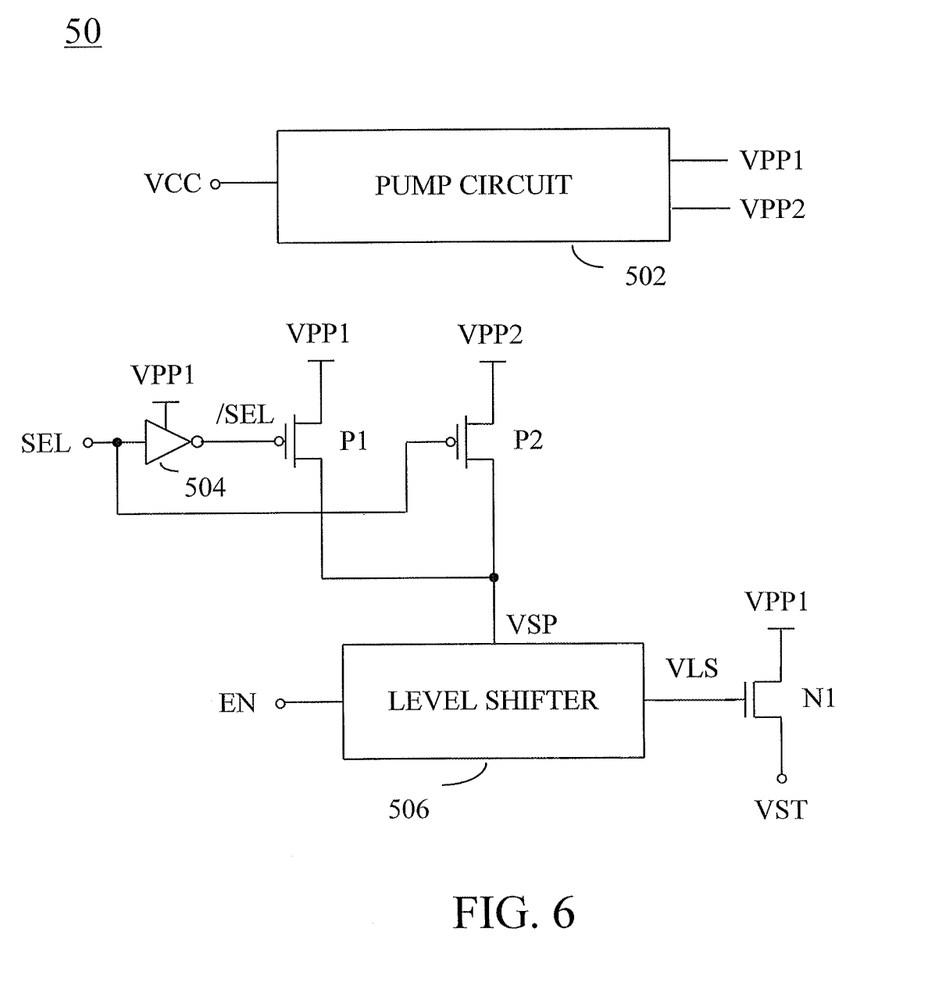
FIG. 6 is a circuit diagram showing an embodiment of the staircase voltage generator of FIG. 4.

FIG. 6 is a circuit diagram showing an embodiment of the staircase voltage generator 50 of FIG. 4. Referring to FIG. 6, the staircase voltage generator 50 comprises a pump circuit 502, an inverter 504, PMOS transistors P1 and P2, an NMOS transistor N1 and a level shifter 506. The pump circuit 502 generates pumped output voltages VPP1 and VPP2, wherein the voltages VPP1 and VPP2 are both higher than a power supply voltage VCC. For example, VCC=3V, VPP1=4V, and VPP2=9V in this case. In this embodiment, the pump circuit 502 is an internal circuit. According to another embodiment of the present invention, the pump circuit 502 is displaced outsize the memory device 40 so as to minimize circuit size and complexity.

Referring to FIG. 6, the inverter 504 inverts an input signal SEL and outputs an inverted signal /SEL to the gate of the PMOS transistor P1. The PMOS transistor P1 has a source coupled to the pumped output voltage VPP1. The PMOS transistor P2 has a source coupled to the pumped output voltage VPP2, a gate coupled to receive the input signal SEL, and a drain coupled to a drain of the PMOS transistor P1. The level shifter 506 receives the voltage at the drain of the PMOS transistor P1 and generates a level shift signal VLS having pulse amplitude varying in staircase fashion in response to the input signal SEL. The NMOS transistor N1 has a drain coupled to the pumped output voltage VPP1, a gate coupled to receive the level shift signal VLS, and a source coupled to generate the staircase voltage VST.

Figure 7:
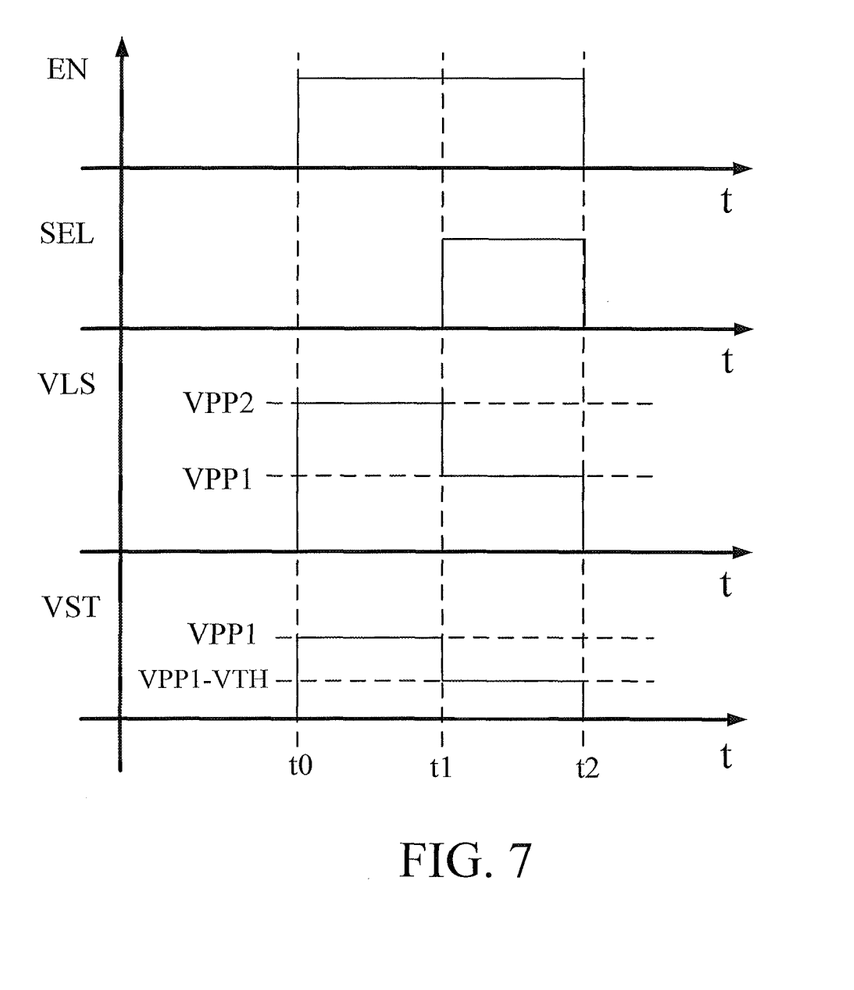
FIG. 7 is a timing diagram showing an operation of the staircase voltage generator of FIG. 6.

FIG. 7 is a timing diagram showing an operation of the staircase voltage generator 50 of FIG. 6. Referring to FIG. 6, the level shifter 506 generates the level shift signal VLS by level-shifting a drain voltage VSP of the PMOS transistor P1 when an enable signal EN is activated. Referring to FIG. 7, the enable signal EN is activated and the input signal SEL has the logic low level at time t0. This causes the PMOS transistor P1 to turn off and the PMOS transistor P2 to turn on, pulling the drain voltage VSP up to the pumped output voltage VPP2. After time t1, the input signal SEL transitions to the logic high level, turning on the PMOS transistor P1 and turning off the PMOS transistor P2. Therefore, the signal VSP is pulled up to the pumped output voltage VPP1. In this manner, the level shifter 506 generates the level shift signal VLS having two voltage levels approximately equal to the voltages VPP2 and VPP1 in response to the signal SEL, and thus the drain voltage of the NMOS transistor N1 has two voltage levels approximately equal to the voltages VPP1 and VPP1-VTH, wherein VTH is the threshold voltage of the NMOS transistor N1.

Figure 8:
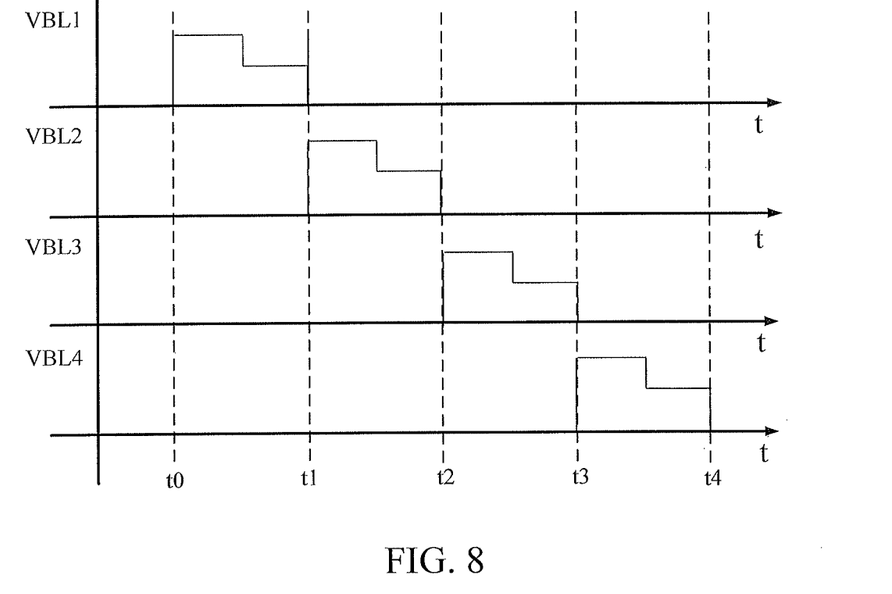
FIG. 8 is a timing diagram showing a programming operation for the memory array shown in FIG. 5 according to one embodiment of the present invention.

Referring now to FIG. 4, as mentioned above, to program the plurality of memory cell transistors in the memory array 42, the voltage pulse generator 50 generates the staircase voltage VST to the column decode and level shift circuit 44 in response to the mode signal PGM issued from the input driver 48. The column decode and level shift circuit 44 sequentially selects one of the bit lines BL1 to BL4, and the staircase voltage VST is applied to the selected bit line as the program voltage. FIG. 8 is a timing diagram showing a more detailed program operation for the memory array 42 according to one embodiment of the present invention. Referring to FIG. 5 and FIG. 8, the first word line WL1 is selected during the time period t0 to t4 when the program operation is performed.

At time t0, the circuit 44 selects the bit line BL1 first, so that the circuit 44 supplies the staircase voltage VST as a program voltage VBL1 to the drain of the cell transistor M1,1 through the bit line BL1. Thereafter, at time t1, the cell transistor M1,2 is selected and the circuit 44 supplies the staircase voltage VST as a program voltage VBL2 to the drain of the cell transistor M1,2 through the bit line BL2. During the time period t2 to t4, the cell transistors M1,3 and M1,4 are selected in sequence, and the circuit 44 supplies the staircase voltage VST as program voltages VBL3 and VBL4 to the drains of the cell transistor M1,3 and M1,4, respectively. Thereafter, similar operations are performed with other cell transistors in the memory array 42 and detailed descriptions thereof will be omitted.

Figure 9:
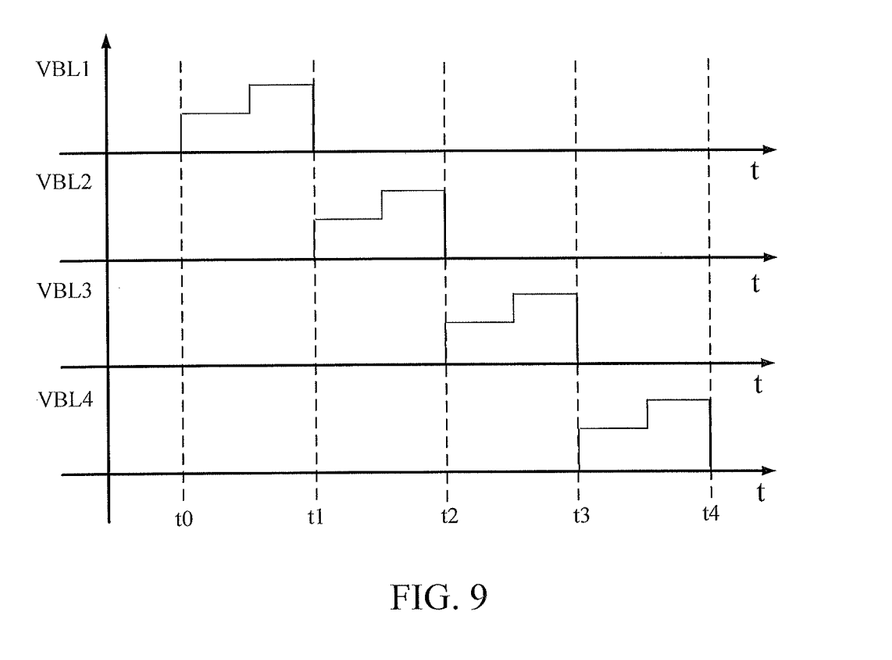
FIG. 9 shows another embodiment of a voltage waveform of the program voltage supplied to different bit lines.

Referring to FIG. 8, in this embodiment, the staircase voltage VST has a staircase waveform that falls in two steps, and thus the cell transistors M1,1 to M1,4 are programmed to have high threshold voltages. However, the present invention is not limited to the embodiment. For example, the program voltage VST can be provided as a series of decrementing voltage steps or provided as a series of incrementing voltage steps. FIG. 9 shows another embodiment of a voltage waveform of the staircase voltage VST supplied to different bit lines. Referring to FIG. 9, the staircase voltage VST has a staircase waveform that rise in two steps.

Figure 10:
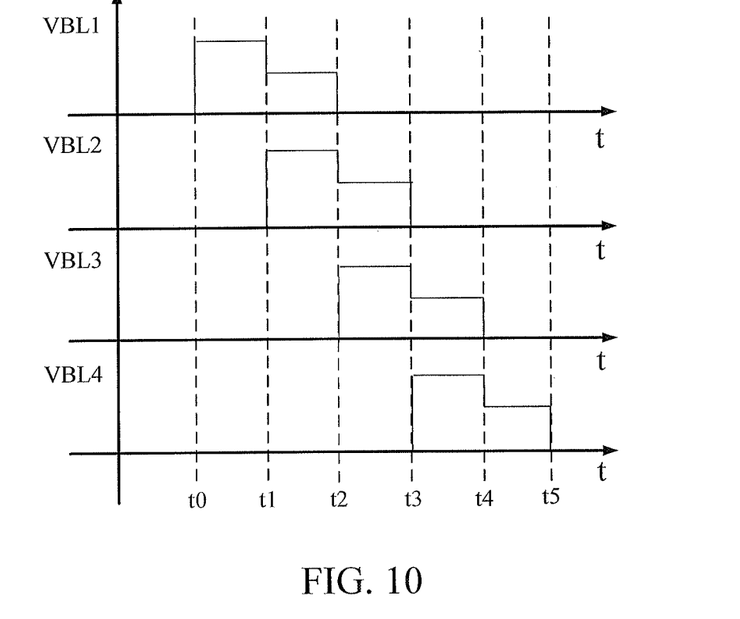
FIG. 10 shows another embodiment of a voltage waveform of the program voltage supplied to different bit lines.
Figure 11:
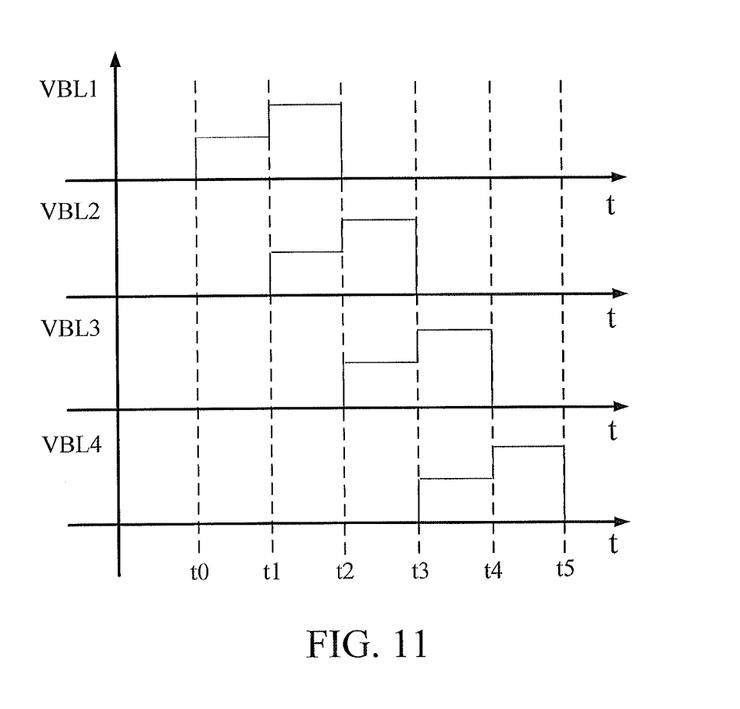
FIG. 11 shows another embodiment of a voltage waveform of the program voltage supplied to different bit lines.

Referring to FIG. 8 and FIG. 9, the program voltages VBL1, VBL2, VBL3, and VBL4 supplied to adjacent bit lines are non-overlapping. In order to reduce the entire program duration of the memory cells, the program voltages applied to adjacent bit lines can be overlapping each other. Referring to FIG. 10 and FIG. 11, the program voltages VBL1, VBL2, VBL3, and VBL4 applied to adjacent bit lines are provided in turn and are overlapping each other. The overlapping amount of the program voltages shown in FIG. 10 and FIG. 11 is about half of the pulse width of the program voltage. However, the overlapping amount between two is successive program voltages can be adjusted to any value. Since the program operations of the memory cell transistors M1,1 to M1,4 are performed one by one, and the program interval for the memory cells coupled to adjacent bit lines overlap each other, the entire program duration of the memory cells is significantly reduced.

The above-described embodiments of the present invention are intended to be illustrative only. Numerous alternative embodiments may be devised by those skilled in the art without departing from the scope of the following claims.

What is claimed is:

1. A nonvolatile semiconductor memory device comprising:
   a memory cell array comprising a plurality of memory cells and a plurality of bit lines coupled to the plurality of memory cells;
   a staircase voltage generator for generating a staircase voltage having a staircase waveform that varies in at least two steps; and
   a decode and level shift circuit for selecting one of said plurality of bit lines and applying the staircase voltage as a program voltage to the selected bit line.

2. The nonvolatile semiconductor memory device of claim 1, wherein the staircase voltage generator generates the staircase voltage having the staircase waveform that rises in at least two steps.

3. The nonvolatile semiconductor memory device of claim 1, wherein the staircase voltage generator generates the staircase voltage having the staircase waveform that falls in at least two steps.

4. The nonvolatile semiconductor memory device of claim 1, wherein the decode and level shift circuit sequentially selects each of the plurality of bit lines, and program times for the memory cells coupled to adjacent bit lines overlap each other.

5. The nonvolatile semiconductor memory device of claim 1, wherein the decode and level shift circuit sequentially selects each of the plurality of bit lines, and program times for the memory cells coupled to adjacent bit lines non-overlap each other.

6. The nonvolatile semiconductor memory device of claim 1, wherein the staircase voltage generator generates the program voltage having the staircase waveform that falls in two steps, and the staircase voltage generator comprises:
   an inverter for generating an inverted signal by inverting a level switch signal;
   a first transistor having a source coupled to a first voltage source, and a gate coupled to receive the inverted signal;
   a second transistor having a source coupled to a second voltage source, a gate coupled to receive the level switch signal, and a drain coupled to the drain of the first transistor;
   a level shifter for receiving a voltage at the drain of the first transistor as a power supply voltage to generate a level shift signal; and
   a third transistor having a drain coupled to the first voltage source, a gate coupled to receive the level shift signal, and a source coupled to generate the staircase voltage;
   wherein the voltage level of the second voltage source is higher than the voltage level of the first voltage source; and
   wherein the staircase voltage generator generates the staircase voltage having the staircase waveform in response to the level switch signal.

7. The nonvolatile semiconductor memory device of claim 6, wherein the decode and level shift circuit sequentially selects each of the plurality of bit lines, and program times for the memory cells coupled to adjacent bit lines overlap each other.

8. The nonvolatile semiconductor memory device of claim 6, wherein the decode and level shift circuit sequentially selects each of the plurality of bit lines, and program times for the memory cells coupled to adjacent bit lines non-overlap each other.

9. The nonvolatile semiconductor memory device of claim 1, wherein the staircase voltage generator generates the program voltage having the staircase waveform that rises in two steps, and the staircase voltage generator comprises:
   an inverter for generating an inverted signal by inverting a level switch signal;
   a first transistor having a source coupled to a first voltage source, and a gate coupled to receive the inverted signal;
   a second transistor having a source coupled to a second voltage source, a gate coupled to receive the level switch signal, and a drain coupled to the drain of the first transistor;
   a level shifter for receiving a voltage at the drain of the first transistor as a power supply voltage to generate a level shift signal; and
   a third transistor having a drain coupled to the first voltage source, a gate coupled to receive the level shift signal, and a source coupled to generate the staircase voltage;
   wherein the voltage level of the second voltage source is higher than the voltage level of the first voltage source; and
   wherein the staircase voltage generator generates the staircase voltage having the staircase waveform in response to the level switch signal.

10. The nonvolatile semiconductor memory device of claim 9, wherein the decode and level shift circuit sequentially selects each of the plurality of bit lines, and program times for the memory cells coupled to adjacent bit lines overlap each other.

11. The nonvolatile semiconductor memory device of claim 9, wherein the decode and level shift circuit sequentially selects each of the plurality of bit lines, and program times for the memory cells coupled to adjacent bit lines non-overlap each other.

* * * * *